(12) United States Patent
Hammond et al.

(10) Patent No.: US 6,900,094 B2
(45) Date of Patent: May 31, 2005

(54) METHOD OF SELECTIVE REMOVAL OF SIGE ALLOYS

(75) Inventors: Richard Hammond, Cambridge, MA (US); Matthew Currie, Boston, MA (US)

(73) Assignee: AmberWave Systems Corporation, Salem, NH (US)

( * ) Notice: Subject to any disclaimer, the term of this patent is extended or adjusted under 35 U.S.C. 154(b) by 0 days.

(21) Appl. No.: 10/172,542

(22) Filed: Jun. 14, 2002

(65) Prior Publication Data

US 2003/0013323 A1 Jan. 16, 2003

Related U.S. Application Data

(60) Provisional application No. 60/298,153, filed on Jun. 14, 2001.

(51) Int. Cl.$^7$ ................. H01L 21/8244; H01L 21/8242; H01L 21/76

(52) U.S. Cl. ................. 438/238; 438/239; 438/439

(58) Field of Search ................. 438/238, 239, 438/202, 439, 458, 739

(56) References Cited

U.S. PATENT DOCUMENTS

| | | | |
|---|---|---|---|
| 4,710,788 A | 12/1987 | Dambkes et al. | |
| 4,920,076 A | 4/1990 | Holland et al. | |
| 4,990,979 A | 2/1991 | Otto | |
| 5,241,197 A | 8/1993 | Murakami et al. | |
| 5,291,439 A | 3/1994 | Kauffmann et al. | |
| 5,312,766 A | 5/1994 | Aronowitz et al. | |
| 5,327,375 A | 7/1994 | Harari | |
| 5,442,205 A | 8/1995 | Brasen et al. | |
| 5,461,243 A | 10/1995 | Ek et al. | |
| 5,523,592 A | 6/1996 | Nakagawa et al. | |
| 5,534,713 A | 7/1996 | Ismail et al. | |
| 5,596,527 A | 1/1997 | Tomioka et al. | |
| 5,617,351 A | 4/1997 | Bertin et al. | |
| 5,683,934 A | 11/1997 | Candelaria | |
| 5,739,567 A | 4/1998 | Wong | |
| 5,777,347 A | 7/1998 | Bartelink | |
| 5,780,922 A | 7/1998 | Mishra et al. | |
| 5,786,612 A | 7/1998 | Otani et al. | |
| 5,792,679 A | 8/1998 | Nakato | |
| 5,808,344 A | 9/1998 | Ismail et al. | |

(Continued)

FOREIGN PATENT DOCUMENTS

| | | |
|---|---|---|
| DE | 41 01 167 A1 | 7/1992 |
| EP | 0 683 522 A2 | 11/1995 |
| EP | 0 829 908 A2 | 3/1998 |

(Continued)

OTHER PUBLICATIONS

"2 Bit/Cell EEPROM Cell Using Band–to–Band Tunneling for Data Read–Out," *IBM Technical Disclosure Bulletin*, vol. 35, No. 4B (Sep. 1992) pp. 136–140.

Aigouy et al., "MOVPE Growth and optical characterization of ZnSe/ZnS strained layer superlattices," *Superlattices and Microstructures*, vol. 16, No. 1 (1994) pp. 71–76.

Anonymous, "Germanium P–Channel Mosfet," *IBM Technical Disclosure Bulletin*, vol. 28, No. 2 (Jul. 1, 1985) p. 500.

(Continued)

*Primary Examiner*—John F. Niebling
(74) *Attorney, Agent, or Firm*—Testa, Hurwitz & Thibeault, LLP

(57) ABSTRACT

A method is disclosed of forming buried channel devices and surface channel devices on a heterostructure semiconductor substrate. In an embodiment, the method includes the steps of providing a structure including a first layer having a first oxidation rate disposed over a second layer having a second oxidation rate wherein the first oxidation rate is greater than the second oxidation rate, reacting said first layer to form a sacrificial layer, and removing said sacrificial layer to expose said second layer.

13 Claims, 6 Drawing Sheets

U.S. PATENT DOCUMENTS

| | | |
|---|---|---|
| 5,847,419 A | 12/1998 | Imai et al. |
| 5,891,769 A | 4/1999 | Liaw et al. |
| 5,906,951 A | 5/1999 | Chu et al. |
| 5,963,817 A | 10/1999 | Chu et al. |
| 5,986,287 A | 11/1999 | Eberl et al. |
| 5,998,807 A | 12/1999 | Lustig et al. |
| 6,013,134 A | 1/2000 | Chu et al. |
| 6,058,044 A | 5/2000 | Sugiura et al. |
| 6,059,895 A | 5/2000 | Chu et al. |
| 6,096,590 A | 8/2000 | Chan et al. |
| 6,107,653 A | 8/2000 | Fitzgerald |
| 6,111,267 A | 8/2000 | Fischer et al. |
| 6,117,750 A | 9/2000 | Bensahel et al. |
| 6,130,453 A | 10/2000 | Mei et al. |
| 6,143,636 A | 11/2000 | Forbes et al. |
| 6,204,529 B1 | 3/2001 | Lung et al. |
| 6,207,977 B1 | 3/2001 | Augusto |
| 6,249,022 B1 | 6/2001 | Lin et al. |
| 6,251,755 B1 | 6/2001 | Furukawa et al. |
| 6,266,278 B1 | 7/2001 | Harari et al. |
| 6,339,232 B1 | 1/2002 | Takagi |
| 6,350,993 B1 | 2/2002 | Chu et al. |
| 6,399,970 B2 | 6/2002 | Kubo et al. |
| 6,498,359 B2 | 12/2002 | Schmidt et al. |
| 2001/0003364 A1 | 6/2001 | Sugawara et al. |
| 2002/0100942 A1 | 8/2002 | Fitzgerald et al. |
| 2002/0123197 A1 | 9/2002 | Fitzgerald et al. |
| 2002/0125471 A1 | 9/2002 | Fitzgerald et al. |
| 2002/0125497 A1 | 9/2002 | Fitzgerald |
| 2002/0140031 A1 | 10/2002 | Rim |
| 2002/0197803 A1 | 12/2002 | Leitz et al. |
| 2003/0013323 A1 | 1/2003 | Hammond et al. |
| 2003/0052334 A1 | 3/2003 | Lee et al. |
| 2003/0057439 A1 | 3/2003 | Fitzgerald |
| 2003/0077867 A1 | 4/2003 | Fitzgerald |
| 2003/0089901 A1 | 5/2003 | Fitzgerald |

FOREIGN PATENT DOCUMENTS

| | | |
|---|---|---|
| EP | 0 838 858 A2 | 4/1998 |
| EP | 0 844 651 A1 | 5/1998 |
| EP | 1 020 900 A2 | 7/2000 |
| EP | 1 174 928 A1 | 1/2002 |
| JP | 63122176 | 5/1988 |
| JP | 4-307974 | 10/1992 |
| JP | 7-106466 | 4/1995 |
| JP | 11-233744 | 8/1999 |
| JP | 2001319935 A2 | 11/2001 |
| JP | 02241195 | 8/2002 |
| WO | WO 98/59365 | 12/1998 |
| WO | WO 99/53539 | 10/1999 |
| WO | WO 00/54338 | 9/2000 |
| WO | WO 01/54202 A1 | 7/2001 |
| WO | WO 01/93338 A1 | 12/2001 |
| WO | WO 01/99169 A2 | 12/2001 |
| WO | WO 02/13262 A2 | 2/2002 |
| WO | WO 02/15244 A2 | 2/2002 |
| WO | WO 02/47168 A2 | 6/2002 |
| WO | WO 02/071488 A1 | 9/2002 |
| WO | WO 02/071491 A1 | 9/2002 |
| WO | WO 02/071495 A1 | 9/2002 |

OTHER PUBLICATIONS

Armstrong et al., "Design of Si/SiGe Heterojunction Complementary Metal–Oxide–Semiconductor Transistors," *IEDM Technical Digest* (1995) pp. 761–764.

Armstrong, "Technology for SiGe Heterostructure-Based CMOS Devices," Submitted to the Massachusetts Institute of Technology Department of Electrical Engineering and Computer Science on Jun. 30, 1999, pp. 1–154.

Barradas et al., "RBS analysis of MBE–grown Si/Ge/(001) Si heterostructures with thin, high Ge content SiGe channels for HMOS transistors," *Modern Physics Letters B* (2001) (abstract).

Bouillon et al., "Search for the optimal channel architecture for 0.18/0.12 $\mu$m bulk CMOS Experiment study," *IEEE* (1996) pp. 21.2.1–21.2.4.

Bufler et al., "Hole transport in strained $Si_{1-x}Ge_x$ substrates," *Journal of Applied Physics*, vol. 84, No. 10 (Nov. 15, 1998) pp. 5597–5602.

Canaperi et al., "Preparation of a relaxed Si–Ge layer on an insulator in fabricating high–speed semiconductor devices with strained epitaxial films," Intern. Business Machines Corporation, USA (2002) (abstract).

Carlin et al., "High Efficiency GaAs–on–Si Solar Cells with High $V_{oc}$ Using Graded GeSi Buffers," *IEEE* (2000) pp. 1006–1011.

Cheng et al., "Electron Mobility Enhancement in Strained–Si n–MOSFETs Fabricated on SiGe–on–Insulator (SGOI) Substrates," *IEEE Electron Device Letters*, vol. 22, No. 7 (Jul. 2001) pp. 321–323.

Cheng et al., "Relaxed Silicon–Germanium on Insulator Substrate by Layer Transfer," *Journal of Electronic Material*, vol. 30, No. 12 (2001) pp. L37–L39.

Cullis et al, "Growth ripples upon strained SiGe epitaxial layers on Si and misfit dislocation interactions," *Journal of Vacuum Science and Technology A*, vol. 12, No. 4 (Jul./Aug. 1994) pp. 1924–1931.

Cullis et al, "The characteristics of strain–modulated surface undulations formed upon epitaxial $Si_{1-x}Ge_x$ alloy layers on Si," *Journal of Crystal Growth*, vol. 123 (1992) pp. 333–343.

Curric et al., "Carrier mobilities and process stability of strained S in– and p–MOSFETs on SiGe virtual substrates," *J. Vac. Sci. Technol. B.*, vol. 19, No 6 (Nov./Dec. 2001) pp. 2268–2279.

Currie et al., "Controlling threading dislocation densities in Ge on Si using graded SiGe layers and chemical–mechanical polishing," *Applied Physics Letters*, vol. 72, No. 14 (Apr. 6, 1998) pp. 1718–1720.

Eaglesham et al., "Dislocation–Free Stranski–Krastanow Growth of Ge on Si(100)," *Physical Review Letters*, vol. 64, No. 16 (Apr. 16, 1990) pp. 1943–1946.

Fischetti et al., "Band structure, deformation potentials, and carrier mobility in strained Si, Ge, and SiGe alloys," *J. Appl. Phys.*, vol. 80, No. 4 (Aug. 15, 1996) pp. 2234–2252.

Fischetti, "Long–range Coulomb interactions in small Si devices. Part II. Effective electronmobility in thin–oxide structures," *Journal of Applied Physics*, vol. 89, No. 2 (Jan. 15, 2001) pp. 1232–1250.

Fitzgerald et al., "Relaxed $Ge_xSi_{1-x}$ structures for III–V integration with Si and high mobility two–dimensional electron gases in Si," *J. Vac. Sci. Technol. B*, vol. 10, No. 4 (Jul./Aug. 1992) pp. 1807–1819.

Fitzgerald et al., "Dislocation dynamics in relaxed graded composition semiconductors," *Materials Science and Engineering B67*, (1999) pp. 53–61.

Fitzgerald et al., "Totally relaxed $Ge_xSi_{1-x}$ layers with low threading dislocation densities growh on Si substrates," *Appl. Phys. Lett.*, vol. 59, No. 7 (Aug. 12, 1991) pp. 811–813.

Garone et al., "Silicon vapor phase epitaxial growth catalysis by the presence of germane," *Applied Physics Letters*, vol. 56, No. 13 (Mar. 26, 1990) pp. 1275–1277.

Grützmacher et al., "Ge segregation in SiGe/Si heterostructures and its dependence on deposition technique and growth atmosphere," *Applied Physics Letters*, vol. 63, No. 18 (Nov. 1, 1993) pp. 2531–2533.

Hackbarth et al., "Alternatives to thick MBE–grown relaxed SiGe buffers," *Thin Solid Films*, vol. 369, No. 1–2 (2000) pp. 148–151.

Hackbarth et al., "Strain relieved SiGe buffers for Si–based heterostructure field–effect transistors," *Journal of Crystal Growth*, vol. 201 (1999) pp. 734–738.

Herzog et al., "SiGe–based FETs: buffer issues and device results," *Thin Solid Films*, vol. 380 (2000) pp. 36–41.

Höck et al., "Carrier mobilities in modulation doped $Si_{1-x}Ge_x$ heterostructures with respect to FET applications," *Thin Solid Films*, vol. 336 (1998) pp. 141–144.

Höck et al., "High hole mobility in $Si_{0.17}Ge_{0.83}$ channel metal–oxide–semiconductor field–effect transistors grown by plasma–enhanced chemical vapor deposition," *Applied Physics Letters*, vol. 76, No. 26 (Jun. 26, 2000) pp. 3920–3922.

Höck et al., "High performance 0.25 $\mu$m p–type Ge/SiGe MODFETs," *Electronics Letters*, vol. 34, No. 19 (Sep. 17, 1998) pp. 1888–1889.

Ismail et al., "Modulation–doped n–type Si/SiGe with inverted interface," *Appl. Phys. Lett.*, vol. 65, No. 10 (Sep. 5, 1994) pp. 1248–1250.

Kearney et al., "The effect of alloy scattering on the mobility of holes in a $Si_{1-x}Ge_x$ quantum well," *Semicond. Sci Technol.*, vol. 13 (1998) pp. 174–180.

Kikkawa et al., "Effect of strained InGaAs step bunching on mobility and device performance in n–InGaP/InGaAs/GaAs pseudomorphic heterostructures grown by metalorganic vapor phase epitaxy," *Journal of Crystal Growth*, vol. 145 (1994) pp. 799–807.

Koester et al., "Extremely High Transconductance Ge/$Si_{0.4}Ge_{0.6}$ p–MODFET's Grown by UHV–CVD," *IEEE Electron Device Letters*, vol. 21, No. 3 (Mar. 2000) pp. 110–112.

König et al., "Design Rules for n–Type SiGe Hetero FETs," *Solid State Electronics*, vol. 41, No. 10 (1997), pp. 1541–1547.

König et al., "p–Type Ge–Channel MODFET's with High Transconductance Grown on Si Substrates," *IEEE Electron Device Letters*, vol. 14, No. 4 (Apr. 1993) pp. 205–207.

Lee et al., "Strained Ge channel p–type metal–oxide–semiconductor field–effect transistors grown on $Si_{1-x}Ge_x$/Si virtual substrates," *Applied Physics Letters*, vol. 79, No. 20 (Nov. 12, 2001) pp. 3344–3346.

Lee et al., "Strained Ge channel p–type MOSFETs fabricated on $Si_{1-x}Ge_x$/Si virtual substrates," *Mat. Res. Soc. Symp. Proc.*, vol. 686 (2002) pp. A1.9.1–A1.9.5.

Leitz et al., "Channel Engineering of SiGe–Based Heterostructures for High Mobility MOSFETs," *Mat. Res. Soc. Symp. Proc.*, vol. 686 (2002) pp. A3.10.1–A3.10.6.

Leitz et al., "Dislocation glide and blocking kinetics in compositionally graded SiGe/Si," *Journal of Applied Plastics*, vol. 90, No. 6 (Sep. 15, 2001) pp. 2730–2736.

Leitz et al., "Hole mobility enhancements in strained Si/$Si_{1-y}Ge_y$ p–type metal–oxide–semiconductor field–effect transistors grown on relaxed $Si_{1-x}Ge_x$ (x<y) virtual substrates," *Applied Physics Letters*, vol. 79, No. 25 (Dec. 17, 2001) pp. 4246–4248.

Li et al., "Design of high speed Si/SiGe heterojunction complementary metal–oxide–semiconductor field effect transistors with reduced short–channel effects," *J. Vac. Sci. Technol.*, A 20(3) (May/Jun. 2002) pp. 1030–1033.

Maiti.et.al., "Strained–Si heterostructure field effect transistors," *Semicond. Sci. Technol.*, vol. 13 (1998) pp. 1225–1246.

Meyerson et al., "Cooperative Growth Phenomena in Silicon/Germanium Low–Temperature Epitaxy," *Applied Physics Letters*, vol. 53, No. 25 (Dec. 19, 1988) pp. 2555–2557.

Mizuno et al., "Electron and Hole Mobility Enhancement in Strained–Si MOSFET's on SiGe–on–Insulator Substrates Fabricated by SIMOX Technology," *IEEE Electron Device Letters*, vol. 21, No. 5 (May 2000) pp. 230–232.

Nayak et al., "High Mobility Strained–Si PMOSFET's," *IEEE Transactions on Electron Devices*, vol. 43, No. 10 (Oct. 1996) pp. 1709–1716.

O'Neill et al., "SiGe Virtual substrate N–channel heterojunction MOSFETS," *Semicond. Sci. Technol.*, vol. 14 (1999) pp. 784–789.

Parker et al., "SiGe heterostructure CMOS circuits and applications," *Solid State Electronics*, vol. 43, No. 8, (Aug. 1999) pp. 1497–1506.

Pelekanos et al., "Interface roughness correlation in CdTe/CdZnTe strained quantum wells," *Journal of Crystal Growth*, vol. 184/185 (1998) pp. 886–889.

Ransom et al., "Gate–Self–Aligned n–channel and p–channel Germanium MOSFET's," *IEEE Transactions on Electron Devices*, vol. 38, No. 12 (Dec. 1991) pp. 2695.

Reinking et al., "Fabrication of High–Mobility Ge p–Channel MOSFETs on Si Substrates," *Electronics Letters*, vol. 35, No. 6 (Mar. 18, 1999) pp. 503–504.

Rim et al., "Enhanced Hole Mobilities in Surface–Channel Strained–Si p–MOSFETs," Solid State Electronics Laboratory, Stanford University, Stanford, CA 94305 (1995) pp. 20.3.1–20.3.4.

Rim et al., "Fabrication and Analysis of Deep Submicron Strained–Si N–MOSFET's," *IEEE Transactions on Electron Devices*, vol. 47, No. 7 (Jul. 2000) pp. 1406–1415.

Rim, "Application of Silicon Based Heterostructures to Enhanced Mobility Metal–Oxide–Semiconductor Field–Effect Transistors," Ph.D. Thesis, Stanford University (Jul. 1999) pp. 1–184.

Robbins et al., "A model for heterogeneous growth of $Si_{1-x}Ge_x$ films for hydrides," *Journal of Applied Physics*, vol. 69, No. 6 (Mar. 15, 1991) pp. 3729–3732.

Rosenblad et al., "Virtual Substrates for the n– and p–type Si–MODFET Grown at Very High Rates," *Materials Science and Engineering*, vol. B74 (2000) pp. 113–117.

Sadek et al., "Design of Si/SiGe Heterojunction Complementary Metal–Oxide–Semiconductor Transistors," *IEEE Transactions on Electron Devices*, vol. 43, No. 8 (Aug. 1996) pp. 1224–1232.

Schäffler, "High–mobility Si and Ge structures," *Semicond. Sci. Technol.*, vol. 12 (1997) pp. 1515–1549.

Srolovitz, "On the Stability of Surfaces of Stressed Solids," *Acta metall.*, vol. 37, No. 2 (1989) pp. 621–625.

Tweet et al., "Factors determining the composition of strained GeSi layers grown with disifane and germane," *Applied Physics Letters*, vol. 65, No. 20 (Nov. 14, 1994) pp. 2579–2581.

Ueno et al., "Low Temperature Buffer Growth for Modulation Doped SiGe/Ge/SiGe Heterostructures with High Hole Mobility," *Thin Solid Films*, vol. 369 (2000) pp. 320–323.

Usami et al., "Spectroscopic study of Si–based quantum wells with neighboring confinement structure," *Semicon. Sci. Technol.* (1997) (abstract).

Welser et al., "Evidence of Real–Space Hot–Electron Transfer in High Mobility, Strained–Si Multilayer MOSFETs," *Electron Devices meetings, 1993, Technical Digest* (Dec. 1993) pp. 21.3.1–21.3.4.

Welser, "The Application of Strained Silicon/Relaxed Silicon Germanium Heterostructures to Metal–Oxide–Semiconductor Field–Effect Transistors," Ph.D. Thesis, Stanford University (1995) pp. 1–205.

Wesler et al., "Electron Mobility Enhancement in Strained–Si N–Type Metal–Oxide–Semiconductor Field–Effect Transistors," *IEEE Electron Device Letters*, vol. 15, No. 3 (Mar. 1994) pp. 100–102.

Wesler et al., "NMOS and PMOS Transistors Fabricated in Strained Silicon/Relaxed Silicon–Germanium Structures," *Electron Devices Meeting, 1992. Technical Digest* (Dec. 13, 1992) pp. 31.7.1–31.7.3.

Wolf et al., "Silicon Processing for the VLSI Era, vol. 1: Processing Technology" (1986) pp. 201.

Xie et al., "Semiconductor Surface Roughness: Dependence on Sign and Magnitude of Bulk Strain," *The Physical Review Letters*, vol. 73, No. 22 (Nov. 28, 1994) pp. 3006–3009.

Xie et al., "Very high mobility two–dimensional hole gas in Si/ $Ge_xSi_{1-x}$/Ge structures grown by molecular beam epitaxy," *Appl. Phys. Lett.*, vol. 63, No. 16 (Oct. 18, 1993) pp. 2263–2264.

Xie, "SiGe Field effect transistors," *Materials Science and Engineering*, vol. 25 (1999) pp. 89–121.

Yousif et al., "Recent Critical Issues in $Si/Si_{1-x}Ge_x$/Si Heterostructure FET Devices," *Solid–State Electronics*, vol. 45, No. 11 (2000) pp. 1931–1937.

International Search Report for International patent application No. PCT/US02/18973, dated Mar. 4, 2003, 7 pages.

METHOD OF SELECTIVE REMOVAL OF SIGE ALLOYS

The present application claims priority to U.S. Provisional Patent Application Ser. No. 60/298,153 filed Jun. 14, 2001.

BACKGROUND OF THE INVENTION

The present invention generally relates to the fabrication of semiconductor substrates from devices, and in particular relates to the use of strained silicon (Si) heterostructure substrates in forming devices such as transistors, for example, for high-performance CMOS integrated circuit products.

As microelectronic systems require faster operating speeds and increased computing power, the need exists for integrated circuits to provide a greater complexity of transistors in a smaller amount of circuit real estate. Such integrated circuits include, for example, microprocessors, ASICs, embedded controllers, and millions of transistors, such as metal oxide silicon semiconductor field-effect transistors (MOSFETs).

Certain microelectronics systems, such as radars, satellites, and cell phones, require low-power, high-speed, and high-density circuits with a high signal-to-noise ratio (i.e., low noise). These low power, high speed, and low noise requirements present a significant design challenge both at the circuit design and at the transistor design level. Microelectronic devices that include both analog and digital circuits are used together to achieve these requirements. Analog devices are used in applications requiring high speed and low noise, whereas digital circuits are used in applications requiring high density and low power.

Microelectronic devices that include both analog and digital circuits on the same substrate typically use traditional Si based MOSFET devices. Analog MOSFET devices, which run on analog signals, typically exhibit noise problems because noise is induced at high frequency when carriers scatter along the $Si/SiO_2$ interface of a traditional MOSFET device. Thus, for high-speed analog devices, field-effect transistors (FETs) are not used; rather, bipolar transistors that do not have conduction along a $Si/SiO_2$ interface are used. Unfortunately, it is difficult and expensive to integrate both bipolar and MOSFET devices on a single substrate.

One way to reduce noise and to achieve devices that are integrated on the same substrate is through changes at the transistor design level by using surface channel devices along with buried channel devices. A conventional Si based buried channel FET device has a channel conduction layer that is buried within a highly doped silicon region. This buried channel device has low noise because the charge carriers in the conduction channel are spatially separated from the $Si/SiO_2$ interface.

While it is possible to build surface channel devices and buried channel devices on the same substrate, the manufacturing process requires complex and extensive process capabilities. For example, use of ion implantation to populate the buried channel requires counterdoping of the layers above the buried channel, and also requires extensive masking steps, adding to the cost and complexity of the overall manufacturing process. Furthermore, the excessive doping required to populate a buried conduction layer within a conventional silicon substrate places fundamental limitations on the performance of such a device.

Further, the use of strained semiconductor devices presents particular problems to the formation of surface channel devices and buried channel devices on the same substrate. For example, U.S. Pat. No. 5,963,817 discloses a method of using local selective oxidation of bulk or strained SiGe for forming buried channel oxide regions involving steps of masking, oxidation (e.g., thermal oxidation), and oxide removal; and U.S. Pat. No. 5,442,205 discloses the formation of surface channel semiconductor heterostructure devices with strained silicon device layers. It has been found, however, that the process of oxidation affects certain strained semiconductors differently. For example, the different layers of a strained semiconductor heterostructure may oxidize or become doped sufficiently differently that device formation procedures are compromised. Moreover, with high thermal budget oxidation, the thin strained semiconductor channels may be destroyed by significant interdiffusion during the high temperature oxidation steps.

There is a need, therefore, for a method of integrating surface channel and buried channel strained silicon devices on the same substrate

SUMMARY OF THE INVENTION

The invention provides a method of selectively removing SuGe alloy layers, thus exposing underlying semiconductor layers. The invention also provides a method of forming buried channel devices and surface channel devices on a heterostructure semiconductor substrate. In an embodiment, the method includes the steps of providing a structure comprising a first layer having a first oxidation rate disposed over a second layer having a second oxidation rate, wherein the first oxidation rate is greater than the second oxidation rate, reacting said first layer to form a sacrificial layer, and removing said sacrificial layer to expose said second layer.

BRIEF DESCRIPTION OF THE DRAWINGS

The following description may be further understood with reference to the accompanying drawing in which.

The drawings are shown for illustrative purposes and are not to scale.

DETAILED DESCRIPTION OF THE INVENTION

The invention provides a simplified method of forming buried and surface channel heterostructure devices on the same substrate. As aforementioned, conventional Si based integrated buried and surface channel devices are typically manufactured using complex implantation procedures. In the present invention, the starting substrate material defines the buried and surface channel device structures. This starting material is a heterostructure where the the different materials in the heterostructure have different oxidation or removal properties. The difference in material properties allows for the selective removal of particular layers and this allows for the integration of varied device structures.

An exemplary embodiment of such a heterostructure substrate is a strained silicon substrate. A strained silicon (Si) substrate is generally formed by providing a relaxed SiGe layer on bulk Si through either epitaxial deposition or wafer bonding, and then providing a Si layer on the relaxed SiGe layer. Because SiGe has a different lattice constant than Si, the Si layer becomes strained and results in enhanced mobilities (and hence improved device performance) compared with bulk Si. The percentage of Ge in the SiGe can have a dramatic effect on the characteristics of the strained Si layer.

In an embodiment, the invention involves the selective removal of SiGe alloys to form buried channel strained Si FET devices and surface channel strained Si FET devices on the same substrate. Using this method, both device types (e.g., digital and analog) may be realized on a common substrate and both have distinct advantages over conventional silicon MOSFET technologies. For example, a strained silicon surface channel device offers an enhanced drive current over a conventional Si based MOSFET due to its enhanced carrier mobilities. Similarly, the band offset of the strained silicon buried channel device offers low noise characteristics due to the spatial separation of the active charge carriers from both the $SiO_2$ interface and any remote impurity atoms introduced via ion implantation.

Figure 1:
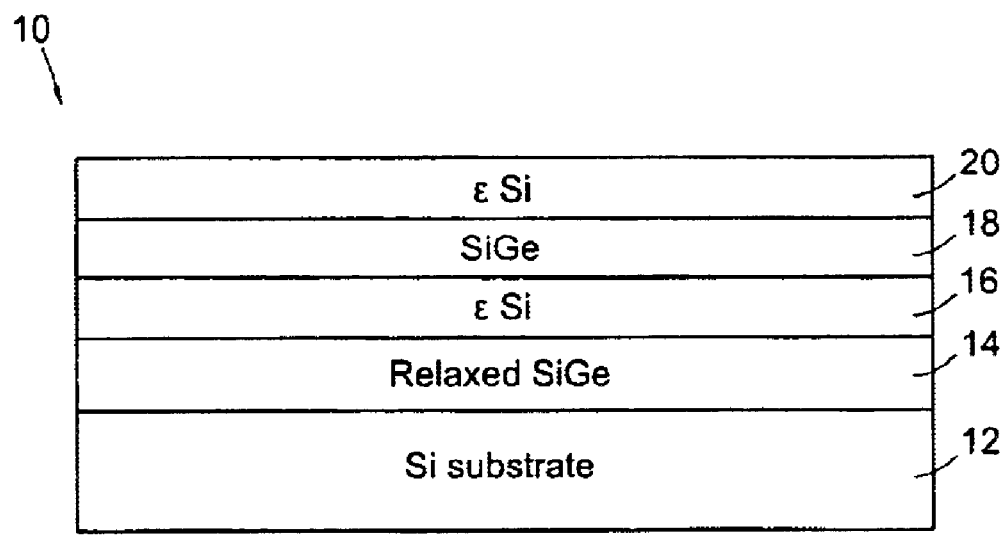
FIGS. 1–9 show diagrammatic views of a heterostructure substrate during a method of providing buried and surface channel devices on the substrate in accordance with an embodiment of the invention.

FIG. 1 shows a diagrammatic cross-sectional view of a substrate 10, comprising a Si layer 12, a relaxed SiGe layer 14, a strained Si layer 16, a second SiGe layer 18, and a second strained Si layer 20. Each of the strained Si layers 16 and 18 may be between 50 Å and 500 Å. The substrate 10 forms an examplary base structure for the present invention. In developing this layered heterostructure substrate 10, epitaxial growth techniques (e.g., chemical vapor deposition) and polishing techniques (for example, chemical mechanical polishing) or wafer bonding techniques, which are known in the art, are applied. Methods of fabricating various strained silicon heterostructures are disclosed in U.S. patent application Ser. No. 09/906,551 filed Jul. 16, 2001 and U.S. patent application Ser. No. 09/928,126 filed Aug. 10, 2001, the disclosures of which are hereby incorporated by reference.

Figure 2:
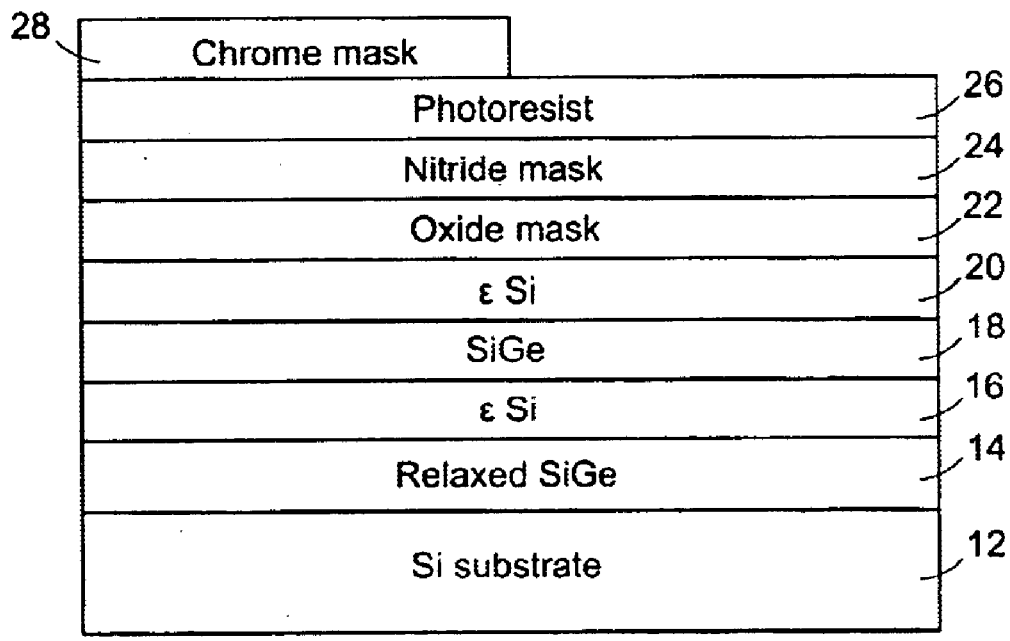

A variety of masking layers are then applied to the substrate of FIG. 1 as shown in FIG. 2. First, an oxide layer 22 is applied to the exposed strained silicon layer 20, followed by a nitride masking layer 24. A photoresist layer 26 is then applied to the nitride mask. Oxide masking layer 22 and nitride masking layer 24 are typically formed using low-pressure chemical vapor deposition (LPCVD), and are approximately 100 Å and 500–1000 Å thick, respectively. The photoresist layer 26 is typically a photosensitive polymer, such as a novolak-based photoresist, which is spun-applied. A chrome mask 28 is then utilized to expose selected regions of the photoresist layer 26 with ultraviolet light The ultraviolet light exposes the uncovered regions of the photoresist layer 26. This is followed by a developing step to remove the exposed regions of the photoresist layer 26.

Figure 3:
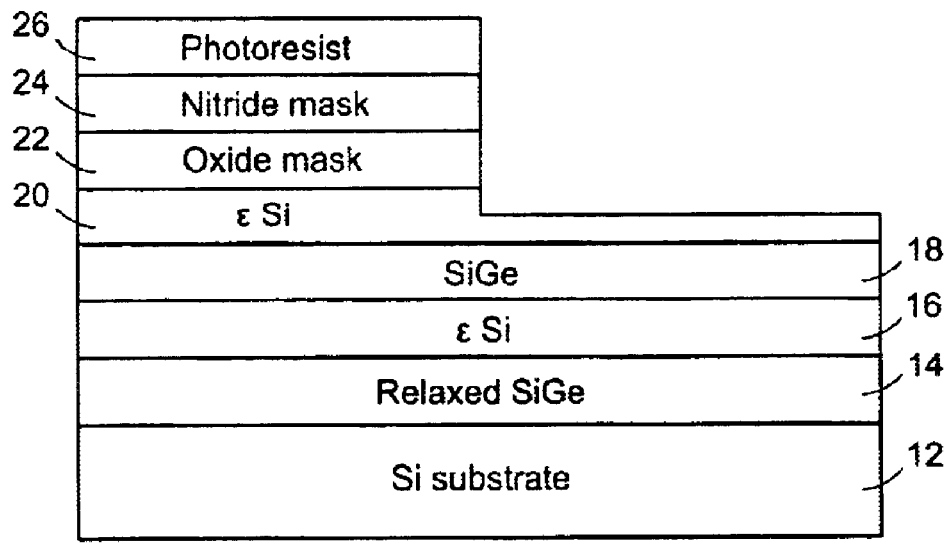
Figure 4:
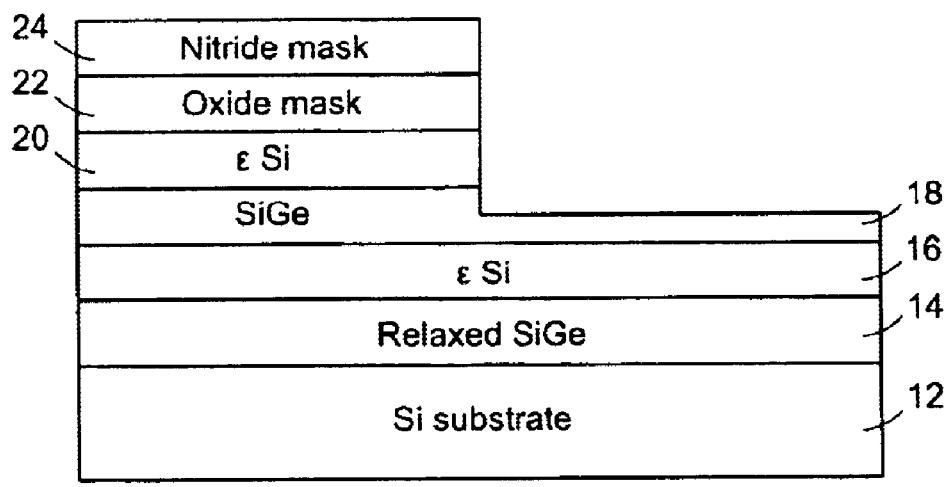

As shown in FIG. 3, after the exposed regions of the photoresist layer 26 are removed, the remaining regions of the photoresist masking layer 26 serve as a mask to etch the exposed regions of nitride masking region 24 and oxide masking region 22. The exposed regions of nitride masking layer 24 are removed by using a hot phosphoric acid, or $CF_4/O_2$ reactive ion etch (RIE), and the exposed regions of oxide masking layer 22 are removed using a HF acid etch step. The photoresist masking region 26 is then removed using a plasma $O_2$ ash. Note that a portion of strained Si cap layer 20 may be removed in the process of removing the exposed region of oxide masking layer 22. The nitride masking region 24 then serves as a mask to etch the strained Si cap layer 20 in, for example, $CF_4/O_2$ RIE as shown in FIG. 4. Note that this step may also etch into a portion of second SiGe layer 18.

Figure 11:
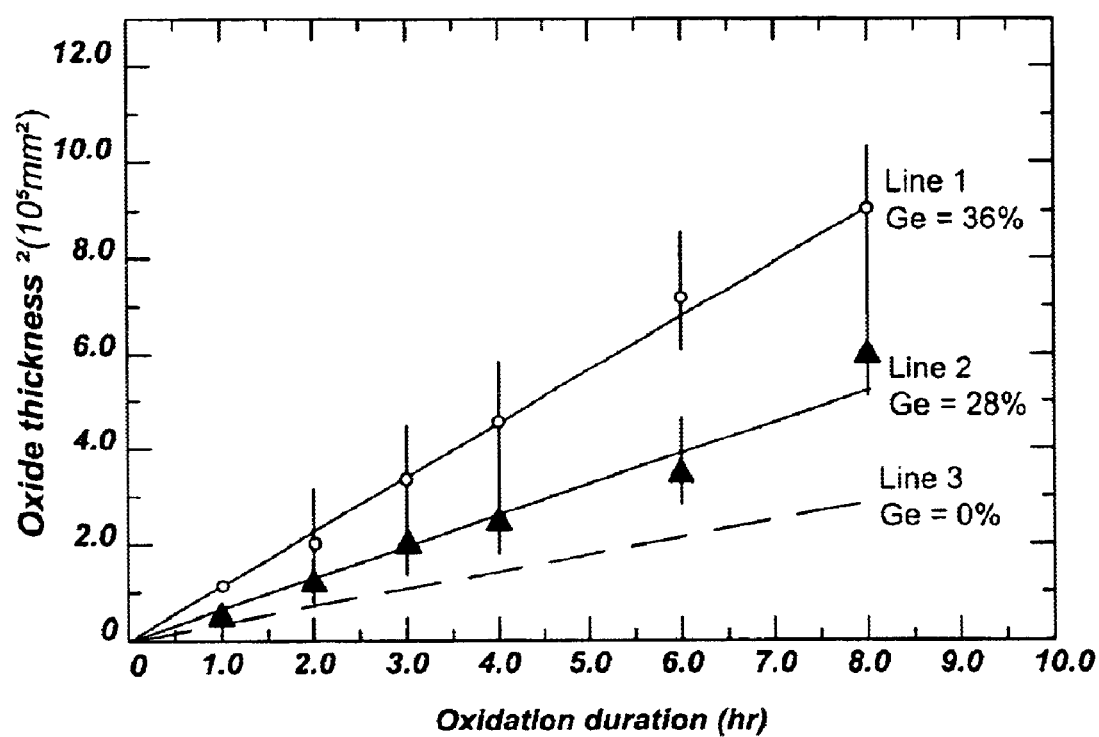
FIG. 11 shows a diagrammatic graphical view of thermal oxidation time versus oxidation thickness for various semiconductor substrates.

The exposed portion of the second SiGe layer 18 is then selectively oxidized to expose the strained Si layer 16 leaving regions 32 of oxidized SiGe, for example, at or below approximately 850° C., and in some applications at or below approximately 700° C. The selective removal requires consideration of oxidation rates for Si and SiGe at various Ge concentrations. For example, FIG. 11 shows that the selectivity of SiGe increases with an increase in concentration of Ge. For a 470 nm SiGe layer, the x-axis is the oxidation duration in hours and the y-axis is the square of the oxide thickness in $10^5$ nm$^2$. Line 1 represents the rate for a 36% Ge concentration in SiGe, line 2 represents a 28% Ge concentration in SiGe, and line 3 represents a 0% Ge concentration (i.e., pure Si). As the Ge concentration in SiGe increases, the oxidation rate increases for certain oxidation conditions. An example of oxidation conditions for which an acceptable oxidation rate differential occurs is oxidation at 700° C. in a wet ambient. This indicates that oxidation of SiGe layer 18 will occur rapidly, and the oxidation step will slow down considerably as the oxidation front reaches the strained Si layer 16. Thus, the controlled selective removal of SiGe layer 18 takes advantage of this differential in oxidation rates. This differential may be further exploited by grading the second SiGe layer 18 such that the Ge concentration is higher at the intersection of second SiGe layer 18 and strained Si layer 16. This expedites the oxidation of second SiGe layer 18 at the intersection of second SiGe layer 18 and strained Si layer 16, thereby avoiding too much erosion of strained Si layer 16.

A differential chemical oxidation rate may also be exploited during a wet chemical processing step. For example, a standard RCA SC-1 clean ($NH_4OH+H_2O_2+H_2O$) may be used to preferentially remove the second SiGe layer 18 over the strained silicon layer 16. Again, this preferential chemical removal is due to the enhanced chemical oxidation rate of SiGe alloys compared to that of silicon.

Figure 5:
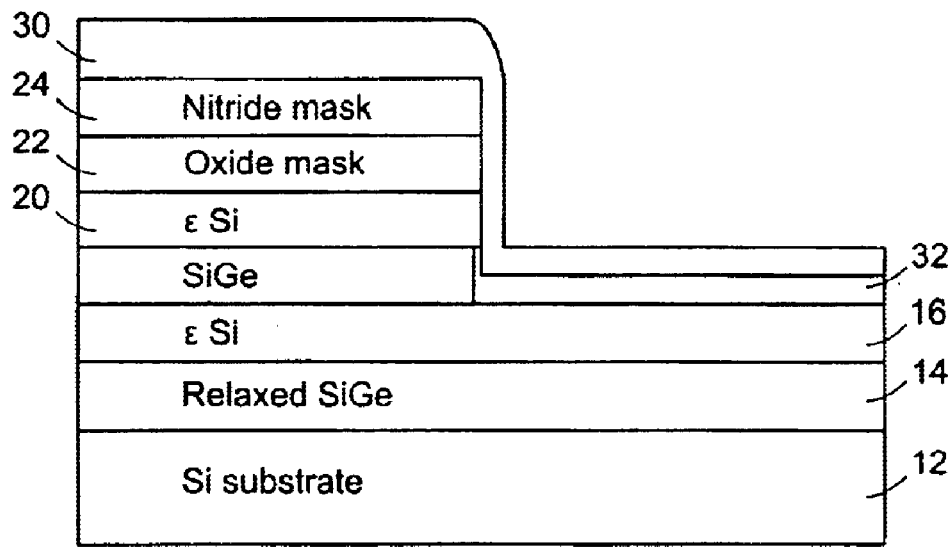
Figure 6:
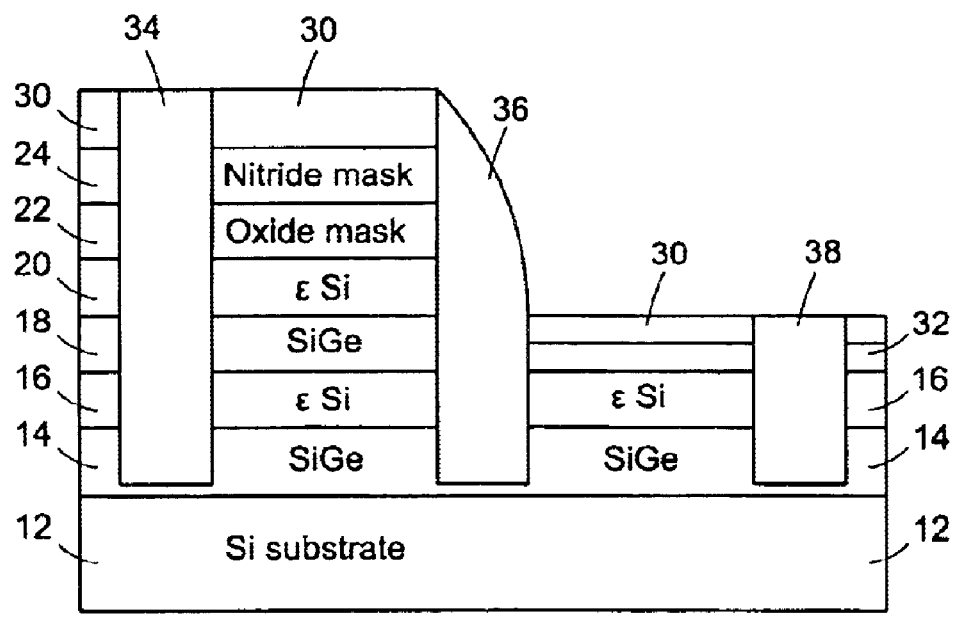

A second nitride layer 30 is then formed using LPCVD (approximately 500–1000 Å thick) over the entire surface of structure as shown in FIG. 5. Note that the oxidized SiGe regions 32 of the SiGe layer 18 may undercut and extend partially underneath strained Si cap layer 20. Isolation trenches 34, 36 and 38 may then be formed to isolate the various regions from one another as shown in FIG. 6. The devices may be isolated from one another as disclosed in U.S. Provisional Patent Application Ser. No. 60/296,976 filed Jun. 8, 2001, the disclosure of which is hereby incorporated by reference.

Figure 7:
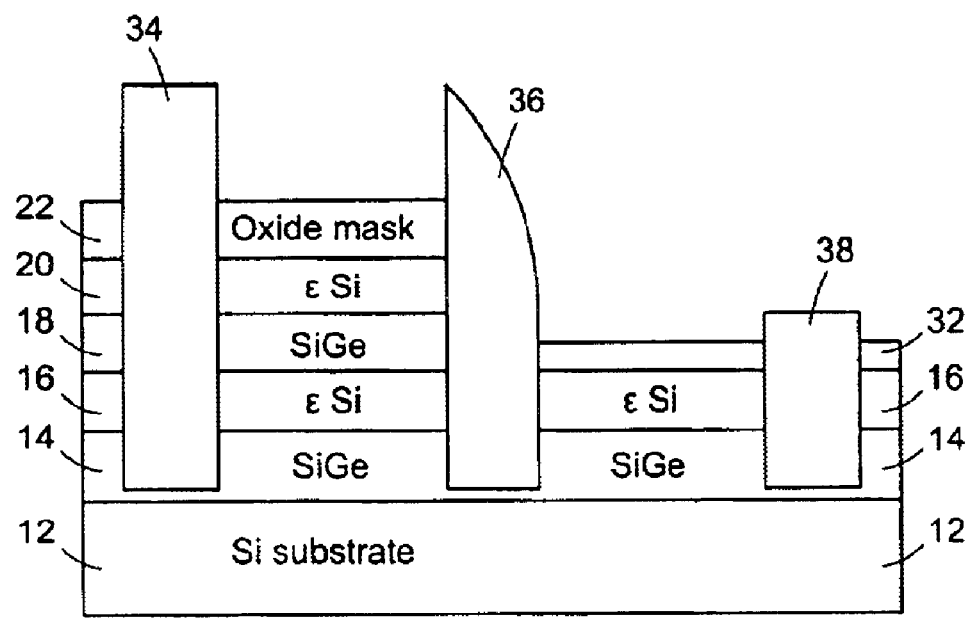
Figure 8:
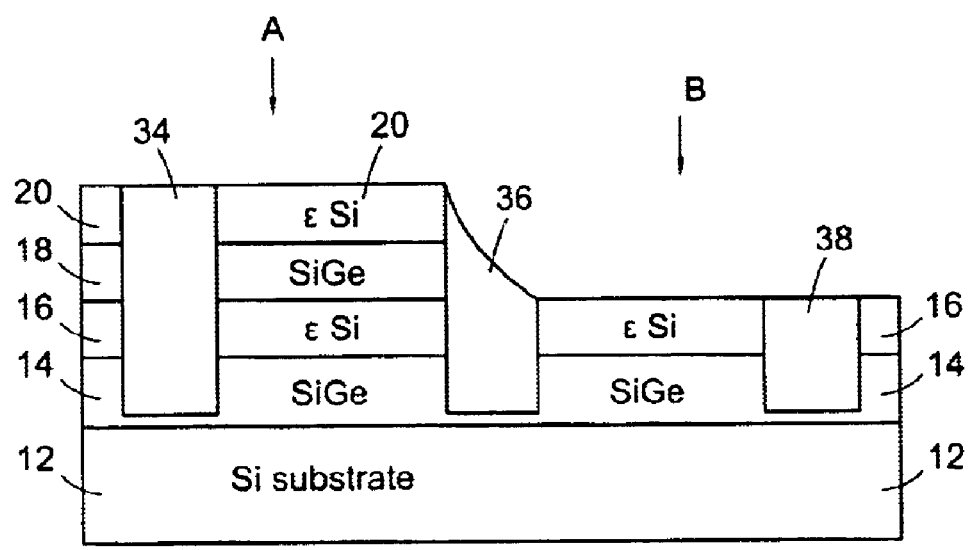

The second nitride layer 30 and the remaining region of the nitride masking layer 24 are then removed via plasma $CF_4/O_2$ or hot phosphoric wet etch as shown in FIG. 7. The oxide masking layer 22 and regions 32 of SiGe oxide are then wet etched using a buffered HF solution. This buffered HF solution etches oxide masking region 22 and SiGe oxide region 32, but stops on strained Si layer 16 and strained Si layer 20. In the same step, first isolation trenches 34, 36 and 38 are then planarized via etching to leave a relatively planar surface in both buried channel device region A and surface channel device region B as shown in FIG. 8. A judicious choice of thickness for oxide masking layer 22 and an appropriate wet chemical etchant results in the degree of planarity required.

Figure 9:
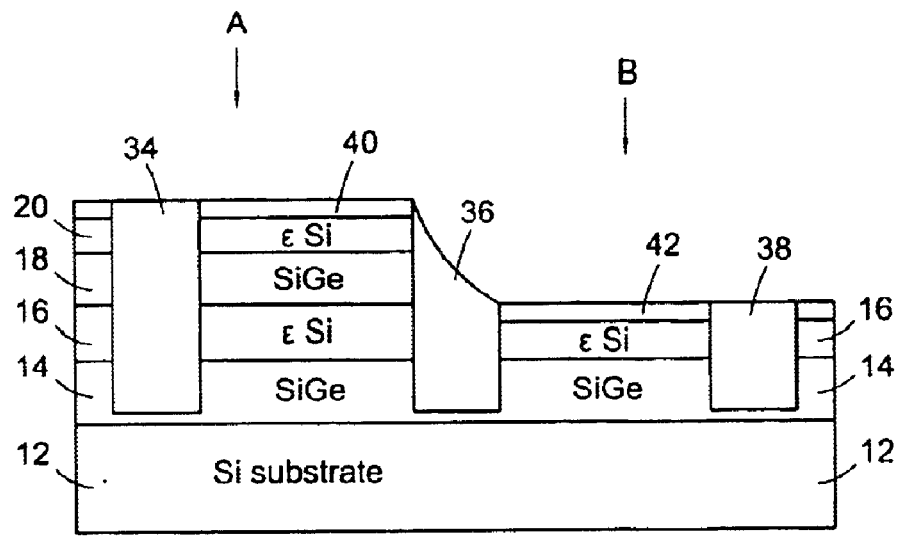
Figure 10:
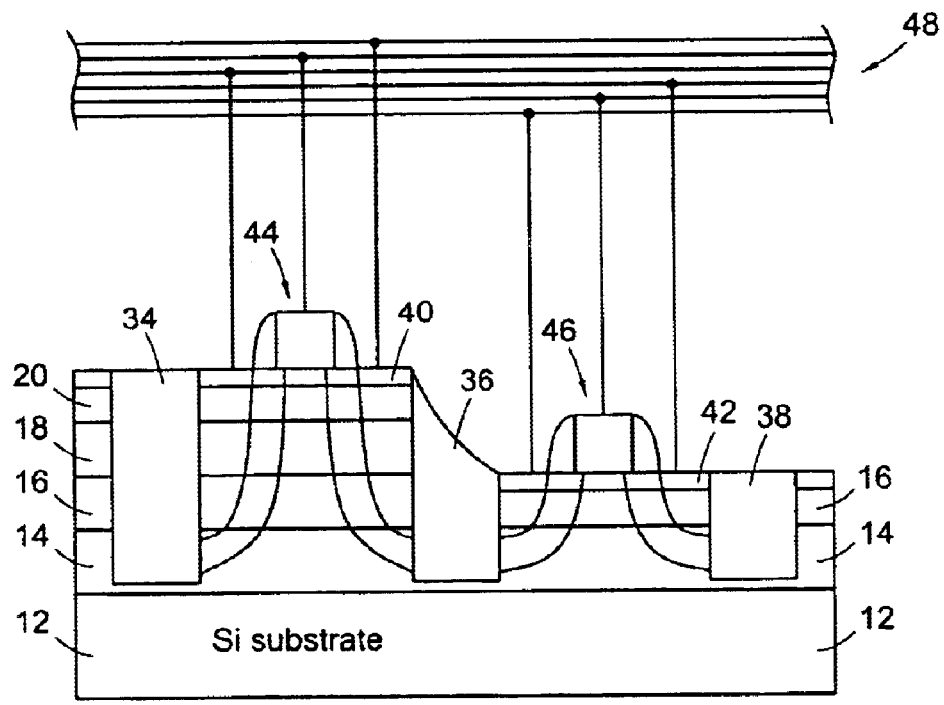
FIG. 10 shows the buried channel device and a surface channel device of FIG. 9 coupled to a circuit.

As shown in FIG. 9, insulator layers 40 and 42 (of for example, $SiO_2$) are then applied to the substrate of FIG. 8 via thermal oxidation of the strained Si layers 16 and 20. The first SiO₂ layer 40 and second SiO₂ layer 42 are the gate dielectric layers upon which buried channel and surface channel MOSFET devices 44 and 46 may be formed as shown in FIG. 10. In other embodiments, a deposited gate dielectric (e.g., a high-k gate dielectric) layer may be used instead of the oxide layers 40 and 42. The buried channel device 44 and the surface channel device 46 each utilize the strained silicon layer 16 as the channel, and each may be coupled to a circuit as generally shown at 48 in FIG. 10. Note that in this example, the devices are fabricated having doped source/drain regions, silicide regions, spacers, and isolation regions.

Although the invention has been shown in connection with a strained Si/SiGe heterostructure, those skilled in the art will appreciate that any heterostructure that allows for the selective removal of the layers overlaying the channel layer will also work. Additionally, instead of a strained Si channel layer, layers of SiGe, Ge or GaAs may be used, alternatively, a plurality of such layers may be used to optimize the transport characteristics. Furthermore, the selective removal of blanket SiGe alloy layers may also be employed during the fabrication of silicon-on-insulator (SOI) and strained silicon-on-insulator (SSOI) substrates.

Those skilled in the art will appreciate that numerous modifications and variations may be made to the above disclosed embodiments without departing from the spirit and scope of the invention.

What is claimed is:

1. A method of forming a semiconductor substrate, comprising:
   providing a structure comprising a first layer having a first oxidation rate disposed over a second layer having a second oxidation rate, wherein the first oxidation rate is greater than the second oxidation rate;
   reacting said first layer to form a sacrificial layer; and
   removing said sacrificial layer to expose said second layer,
   wherein the second layer comprises a strained semiconductor.

2. A method of forming a semiconductor substrate, comprising:
   providing a structure comprising a first aver having a first oxidation rate disposed over a second layer having a second oxidation rate, wherein the first oxidation rate is greater than the second oxidation rate;
   reacting said first layer to form a sacrificial layer; and
   removing said sacrificial layer to expose said second layer,
   wherein the second layer comprises Si.

3. A method of forming a semiconductor substrate, comprising:
   providing a structure comprising a first layer having a first oxidation rate disposed over a second layer having a second oxidation rate, wherein the first oxidation rate is greater than the second oxidation rate;
   reacting said first layer to form a sacrificial layer; and
   removing said sacrificial layer to expose said second layer,
   wherein said semiconductor substrate further comprises an insulator layer disposed beneath said second layer.

4. The method as claimed in claim 3, wherein said insulator layer comprises silicon dioxide.

5. A method of forming a semiconductor substrate, comprising:
   providing a structure comprising a first layer having a first oxidation rate disposed over a second layer having a second oxidation rate, wherein the first oxidation rate is greater than the second oxidation rate;
   reacting said first layer to form a sacrificial layer, wherein said reacting comprises thermal oxidation performed at or below a temperature of approximately 850° C.; and
   removing said sacrificial layer to expose said second layer.

6. A method of forming a semiconductor substrate, comprising:
   providing a structure comprising a first layer having a first oxidation rate disposed over a second layer having a second oxidation rate, wherein the first oxidation rate is greater than the second oxidation rate;
   reacting said first layer to form a sacrificial layer; and
   removing said sacrificial layer to expose said second layer,
   wherein said step of reacting said first layer to form a sacrificial layer comprises chemical oxidation.

7. A method of forming a semiconductor substrate, comprising:
   providing a structure comprising a first layer having a first oxidation rate disposed over a second layer having a second oxidation rate, wherein the first oxidation rate is greater than the second oxidation rate;
   reacting said first layer to form a sacrificial layer; and
   removing said sacrificial aver to expose said second layer,
   wherein said step of reacting said first layer to form a sacrificial layer is performed on a first region of said first layer and not on a second region of said first layer.

8. The method as claimed in claim 7, wherein said method further comprises forming a surface channel device in said first region.

9. The method as claimed in claim 7, wherein said method further comprises forming a buried channel device in said second region.

10. The method as claimed in claim 7, wherein said method further comprises:
    forming a surface channel device in said first region; and
    forming a buried channel device in said second region, wherein the channel of said surface channel device and said buried channel device comprises a second device layer.

11. The method as claimed in claim 10, wherein said second layer comprises Si and said first layer comprises SiGe.

12. A method of forming devices on a substrate said method comprising the steps of:
    providing a structure comprising a SiGe layer disposed over a strained semiconductor layer; and
    selectively removing said SiGe layer in a first region but not in a second region such that a surface channel device may be formed on said first region and a buried channel device may be formed on said second region.

13. A method of forming devices on a substrate, said method comprising the steps of
    providing a structure comprising a SiGe layer disposed over a strained semiconductor layer;
    oxidizing said SiGe layer to form a SiGe oxide in a first region but not in a second region of said structure;
    removing said SiGe oxide; and
    forming a surface channel device in said first region and a buried channel device in said second region such that the strained semiconductor layer serves as the channel layer of each device.

* * * * *

(12) INTER PARTES REEXAMINATION CERTIFICATE (0048th)
United States Patent
Hammond et al.

(10) Number: US 6,900,094 C1
(45) Certificate Issued: Jan. 27, 2009

(54) METHOD OF SELECTIVE REMOVAL OF SIGE ALLOYS

(75) Inventors: Richard Hammond, Cambridge, MA (US); Matthew Currie, Boston, MA (US)

(73) Assignee: Amberwave Systems Corporation, Salem, NH (US)

Reexamination Request:
No. 95/000,175, Aug. 2, 2006

Reexamination Certificate for:
Patent No.: 6,900,094
Issued: May 31, 2005
Appl. No.: 10/172,542
Filed: Jun. 14, 2002

Related U.S. Application Data

(60) Provisional application No. 60/298,153, filed on Jun. 14, 2001.

(51) Int. Cl.
*H01L 21/76* (2006.01)
*H01L 21/02* (2006.01)
*H01L 21/469* (2006.01)
*H01L 21/31* (2006.01)
*H01L 21/8244* (2006.01)

(52) U.S. Cl. .................. 438/238; 438/239; 438/439
(58) Field of Classification Search .................. None
See application file for complete search history.

(56) References Cited

U.S. PATENT DOCUMENTS

| | | | |
|---|---|---|---|
| 5,417,180 A | | 5/1995 | Nakamura |
| 5,808,344 A | | 9/1998 | Ismail et al. .............. 257/369 |
| 5,906,951 A | * | 5/1999 | Chu et al. .................. 438/751 |
| 6,348,407 B1 | | 2/2002 | Gupta et al. ............... 438/637 |
| 6,407,406 B1 | | 6/2002 | Tezuka et al. .............. 257/18 |
| 6,423,989 B1 | | 7/2002 | Nakano et al. ............. 257/192 |
| 6,468,869 B1 | | 10/2002 | Yang et al. ................ 438/278 |
| 6,531,324 B2 | | 3/2003 | Hsu et al. .................. 438/3 |
| 6,541,321 B1 | | 4/2003 | Buller et al. ............... 438/197 |
| 6,551,399 B1 | | 4/2003 | Sneh et al. ................ 117/102 |
| 6,559,040 B1 | | 5/2003 | Yu et al. ................... 438/585 |
| 6,563,260 B1 | | 5/2003 | Yamamoto et al. ......... 313/495 |
| 6,570,205 B2 | | 5/2003 | Shin et al. ................ 257/296 |
| 6,646,322 B2 | * | 11/2003 | Fitzgerald ................. 257/531 |
| 6,689,211 B1 | * | 2/2004 | Wu et al. .................. 117/94 |
| 6,846,715 B2 | | 1/2005 | Fitzgerald et al. |
| 6,974,735 B2 | | 12/2005 | Fitzgerald |

OTHER PUBLICATIONS

Wolf, S., et al., Silicon Processing For The VLSI Era: vol. 1—Process Technology, "Thermal Oxidation of Single Crystal Silicon," pp. 198, (Lattice Press 1986).

Lasky, J.B., et al., "SOI by bonding and Etchback," IEEE IEDM Tech. Dig., pp. 684–687, (1985).

Warabisako, T., et al., "Characterization of Laser–SOI Double Si Active Layers by Fabricating Elementary Device Structures," IEEE IEDM Tech. Dig., pp. 433–436, (1982).

Kubota, M., et al., "New SOI CMOS Process with Selective Oxidation," IEEE IEDM Tech. Dig., pp. 814–816, (1986).

Rhee, S.S, et al., "SiGe Resonant Tunneling Hot Carrier Transistor," IEEE IEDM Tech. Dig., pp. 651–654, (1989).

Ismail, K., "Si/Sige High–Speed Field–Effect Transistors," IEEE IEDM Tech. Dig., pp. 509–512, (1995).

(Continued)

*Primary Examiner*—Erik Kielin

(57) ABSTRACT

A method is disclosed of forming buried channel devices and surface channel devices on a heterostructure semiconductor substrate. In an embodiment, the method includes the steps of providing a structure including a first layer having a first oxidation rate disposed over a second layer having a second oxidation rate wherein the first oxidation rate is greater than the second oxidation rate, reacting said first layer to form a sacrificial layer, and removing said sacrificial layer to expose said second layer.

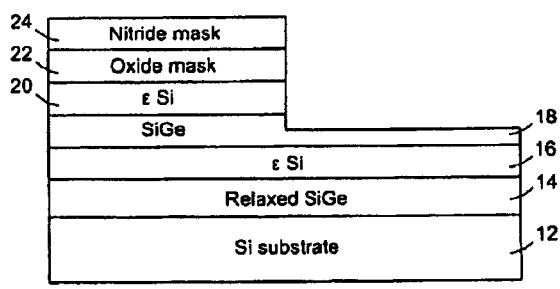

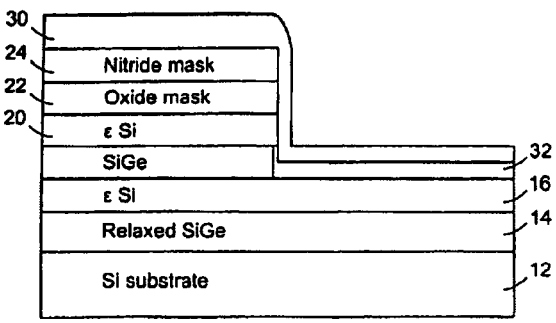

OTHER PUBLICATIONS

Legoues, F.K., et al., "Oxidation studies of SiGe," J. Appl. Phys. 65 (4), pp. 1724–1728, (Feb. 15, 1989).

Chang, G.K., et al., "Selective Etching of SiGe on SiGe/Si Heterostructures," J. Electrochem. Soc., vol. 138, No. 1, pp. 202–204, (Jan. 1991).

Wolf, S., Silicon Processing For The VLSI Era: vol 2 —Process Integration, pp. 66–83 (Lattice Press 1990).

Armstrong et al., "Design of Si/SiGe Heterojunction Complementary Metal–Oxide–Semiconductor Transistors," 1995 IEEE IEDM Tech. Dig., pp. 761–764.

Carlin et al., High Efficiency GaAs–on–Si Solar Cells with High $V_{oc}$ Using Graded GeSi Buffers, IEEE, pp. 1006–1011 (2000).

König et al., "SiGe HBTs and HFETs," Solid–State Electronics, vol. 38, No. 9, pp. 1595–1602 (1995).

* cited by examiner

INTER PARTES REEXAMINATION CERTIFICATE ISSUED UNDER 35 U.S.C. 316

THE PATENT IS HEREBY AMENDED AS INDICATED BELOW.

AS A RESULT OF REEXAMINATION, IT HAS BEEN DETERMINED THAT:

Claims 1–13 are cancelled.

* * * * *